United States Patent
Song et al.

(10) Patent No.: US 6,900,871 B1
(45) Date of Patent: May 31, 2005

(54) THIN FILM TRANSISTOR SUBSTRATE OF LIQUID CRYSTAL DISPLAY AND METHOD OF MANUFACTURE

(75) Inventors: In Duk Song, Kumi-Shi (KR); Won Gyun Yoon, Kumi-Shi (KR); Keuk Sang Kwon, Kumi-Shi (KR)

(73) Assignee: LG. Philips LCD Co. Ltd., Seoul (KR)

( * ) Notice: Subject to any disclaimer, the term of this patent is extended or adjusted under 35 U.S.C. 154(b) by 173 days.

(21) Appl. No.: 09/667,596

(22) Filed: Sep. 22, 2000

(30) Foreign Application Priority Data

Feb. 24, 2000 (KR) .......................................... P2000-8952

(51) Int. Cl.$^7$ ......................... G02F 1/1343; G02F 1/136; H01L 29/15; G09G 3/36
(52) U.S. Cl. ......................... 349/139; 349/39; 349/43; 257/72; 345/92
(58) Field of Search ........................... 349/139, 39, 43, 349/42; 257/72; 345/92

(56) References Cited

U.S. PATENT DOCUMENTS

| | | | | |
|---|---|---|---|---|
| 5,182,661 A | * | 1/1993 | Ikeda et al. .................... | 359/54 |
| 5,435,324 A | | 7/1995 | Brill | |
| 5,708,483 A | | 1/1998 | Asai | |
| 5,737,049 A | * | 4/1998 | Shin ........................... | 349/122 |
| 5,742,363 A | * | 4/1998 | Bae ............................ | 349/38 |
| 5,767,926 A | * | 6/1998 | Kim et al. .................... | 349/38 |
| 5,982,467 A | * | 11/1999 | Lee ............................ | 349/138 |
| 5,995,175 A | * | 11/1999 | Kim et al. .................... | 349/43 |
| 6,088,072 A | * | 7/2000 | Lee ............................. | 349/39 |
| 6,100,953 A | * | 8/2000 | Kim et al. .................... | 349/129 |
| 6,118,508 A | * | 9/2000 | Park ........................... | 349/141 |
| 6,133,967 A | * | 10/2000 | Moon .......................... | 349/39 |
| 6,165,810 A | * | 12/2000 | Morimoto .................... | 438/30 |
| 6,411,346 B1 | * | 6/2002 | Numano et al. .............. | 349/39 |

FOREIGN PATENT DOCUMENTS

| | | | | |
|---|---|---|---|---|
| JP | 361080226 A | * | 4/1986 | |
| JP | 03-148636 | | 6/1991 | |
| JP | 404214537 A | * | 8/1992 | |
| JP | 411024108 A | * | 1/1999 | |
| KR | 1999-3546 | | 1/1999 | |

* cited by examiner

*Primary Examiner*—Tarifur R. Chowdhury
*Assistant Examiner*—Hoan Chau Nguyen
(74) *Attorney, Agent, or Firm*—Birch Stewart Kolasch & Birch, LLP

(57) ABSTRACT

The thin film transistor substrate increases an aperture ratio as well as prevents shorts between pixel electrodes by connecting drain electrodes of thin film transistors to storage electrodes to reduce the number of holes contacting the pixel electrodes. In the method of forming the thin film transistor substrate, drain electrode patterns are formed such that drain electrodes included in thin film transistors are electrically connected to storage electrodes included in storage capacitors. Accordingly, the number of holes contacting the pixel electrodes can be reduced so that an aperture ratio can be increased, or shorts between pixel electrodes can be prevented. Also, the drain electrode patterns are formed from the same conductive layer as the data lines supplying data signals to the thin film transistors, and a constant spacing between the two can be obtained to maintain a uniform parasitic capacitance therebetween and prevent deterioration of the data signal.

31 Claims, 5 Drawing Sheets

THIN FILM TRANSISTOR SUBSTRATE OF LIQUID CRYSTAL DISPLAY AND METHOD OF MANUFACTURE

BACKGROUND OF THE INVENTION

1. Field of the Invention

The present invention relates to a liquid crystal display, and more particularly to a thin film transistor substrate, which has increased aperture ratio, prevents shorts between pixel electrodes and/or reduces the number of holes for contacting the pixel electrodes, and a method of manufacturing the thin film transistor substrate.

2. Description of the Related Art

Generally, a liquid crystal display (LCD) displays a picture by controlling light transmissivity using an electric field. To this end, the LCD includes a liquid crystal panel having liquid crystal cells arranged in a matrix, and a driving circuit for driving the liquid crystal panel. The liquid crystal panel is provided with pixel electrodes for applying an electric field to each liquid crystal cell with respect to a reference electrode, that is, a common electrode. Typically, the pixel electrodes are provided on a lower substrate for each liquid crystal cell, whereas the common electrode is integrally formed on the entire surface of an upper, opposing substrate. Each of the pixel electrodes is connected to a thin film transistor (TFT) used as a switching device. The pixel electrode drives the liquid crystal cell in accordance with a data signal applied via the TFT.

FIG. 1 shows an electrode arrangement of a thin film transistor substrate of a conventional liquid crystal display. In FIG. 1, the LCD includes thin film transistors 8 positioned at the intersections between data lines 4 and gate lines 2, and pixel electrodes 6 connected to drain electrodes 14 of the thin film transistors 8. Each of the thin film transistors 8 includes a gate electrode 10 protruding from the gate line 2, a source electrode 12 protruding from the data line 4, and the drain electrode 14 connected to the pixel electrode 6 via a first contact hole 20. Further, each thin film transistor 8 includes a gate-insulating film (not shown) insulating the gate electrode 10 from a semiconductor layer (not shown), which defines a conductive channel between the source electrode 12 and the drain electrode 14 when a large enough gate voltage is applied to the gate electrode 10. The thin film transistor 8 responds to a gate signal from the gate line 2 to selectively apply a data signal from the data line 2 to the pixel electrode 6.

The pixel electrode 6 is located at a cell area defined by the data line 4 and the gate line 2 and is made from an ITO (indium tin oxide) with a high light transmissivity. The pixel electrode 6 is formed on a protective film (not shown) coated on the entire surface of the thin film transistor 8, and is electrically connected, via the first contact hole 20 formed in the protective film, to the drain electrode 14. The pixel electrode 6 generates a potential difference with respect to a common transparent electrode (not shown) provided at an upper substrate, opposing the thin film transistor substrate, in response to a data signal applied via the thin film transistor 8. By this potential difference, liquid crystal positioned between the thin film transistor substrate and the upper substrate is rotated to allow light, from a light source, to pass therethrough.

As further shown in FIG. 1, storage capacitor 18 and the prior or pre-stage gate line 2 are overlapped by a portion of the pixel electrode 6. The storage capacitor 18 prevents a voltage variation in the pixel electrode 6 by charging to a voltage when a gate high voltage is applied to the pre-stage gate line 2 and discharging the charge voltage when a data signal is applied to the pixel electrode 6. The storage capacitor 18 must have a large capacitance value so as to maintain a stable pixel voltage. To this end, the storage capacitor 18 is formed by the pre-stage gate line 2, an overlapping storage electrode 16, and the gate insulating film (not shown) disposed therebetween. The storage electrode 16 is electrically connected, via a second contact hole 22 formed in the protective film (not shown), to the pixel electrode 6. The storage electrode 16 is provided on the gate insulating film at the time of forming the data line 4 and the source and drain electrodes 12 and 14.

As described above, in the conventional thin film transistor substrate, the overlapping portion of the pixel electrode 6 and the pre-stage gate line 2 must be as large as possible so as to provide a storage capacitor with a large capacitance value. As a result, the distance between the pixels 6 adjacent to each other at the upper and lower portions thereof is reduced, and a short may be generated between them.

Also, inorganic film with a large dielectric constant, such as $SiN_x$, and $SiO_x$, is usually used for the protective film of the thin film transistor substrate. This inorganic protective film typically maintains a constant horizontal interval (e.g., 3 to 5 $\mu$m) between the pixel electrode 6 and the data line 4 to minimize a coupling effect caused by a parasitic capacitor Cds.

However, during processing, particularly the several light-exposing steps, miss alignment errors can occur between electrodes formed from different layers. As a result, a constant interval may not be maintained between the data line 4 and the pixel electrode 6, and a capacitance of the parasitic capacitor Cds between the data line 4 and the pixel electrode 6 becomes non-uniform. A data signal, applied to the data line 4 and then to the pixel electrode 6 is deteriorated due to the coupling effect caused by this non-uniform parasitic capacitor Cds, and picture quality thus deteriorates.

Furthermore, in the conventional LCD, an aperture ratio is reduced by as much as the drain electrode 14 of the thin film transistor 8 overlaps the pixel electrode 6 for formation of the contact hole 20.

SUMMARY OF THE INVENTION

The thin film transistor substrate according to the present invention includes a plurality of gate lines formed on a substrate and a plurality of data lines insulated from and intersecting the gate lines. The data lines and intersecting gate lines define a plurality of cells. At least one cell includes a pixel electrode, a thin film transistor connected to one of the data lines and one of the gate lines defining the cell, a storage capacitor, and a metallic pattern forming a drain electrode of the thin film transistor and a storage electrode of the storage capacitor.

In one embodiment, the metallic pattern is electrically connected to the pixel electrode at the storage electrode part. Because the storage electrode part is electrically connected to the drain electrode part, no separate connection between the drain electrode and the pixel electrode is required. As a result, the size of the drain electrode is reduced, the effective size of the pixel electrode is increased, and the aperature ratio of the thin film transistor substrate is increased.

In another embodiment, the metallic pattern is electrically connected to the pixel electrode at the drain electrode part. Because the drain electrode part is electrically connected to the storage electrode part, no separate connection between the storage electrode and the pixel electrode is required. As a result, the pixel electrode does not need to overlap the pre-stage gate line, and shorts caused by adjacent pixel electrodes being too closely spaced can be eliminated.

In yet another embodiment, the metallic pattern is electrically connected to the pixel electrode at both the drain and storage electrode parts. Preferably, in this embodiment, the metallic pattern has an annular shape approximating the periphery of the pixel electrode, and therefore, prevents light from leaking from the cell.

Preferably, in each of the embodiments, the data lines and metallic pattern are formed simultaneously from the same conductive material such that a constant predetermined minimum spacing is achieved between the metallic pattern and an adjacent data line. Consequently, a uniform parasitic capacitor, formed by the metallic pattern and the adjacent data line, is obtained, and the deterioration of the data signal is prevented.

BRIEF DESCRIPTION OF THE DRAWINGS

The achieved advantages of the invention will be apparent from the following detailed description of the embodiments of the present invention with reference to the accompanying drawings, in which.

DETAILED DESCRIPTION OF THE PREFERRED EMBODIMENTS

Figure 1:
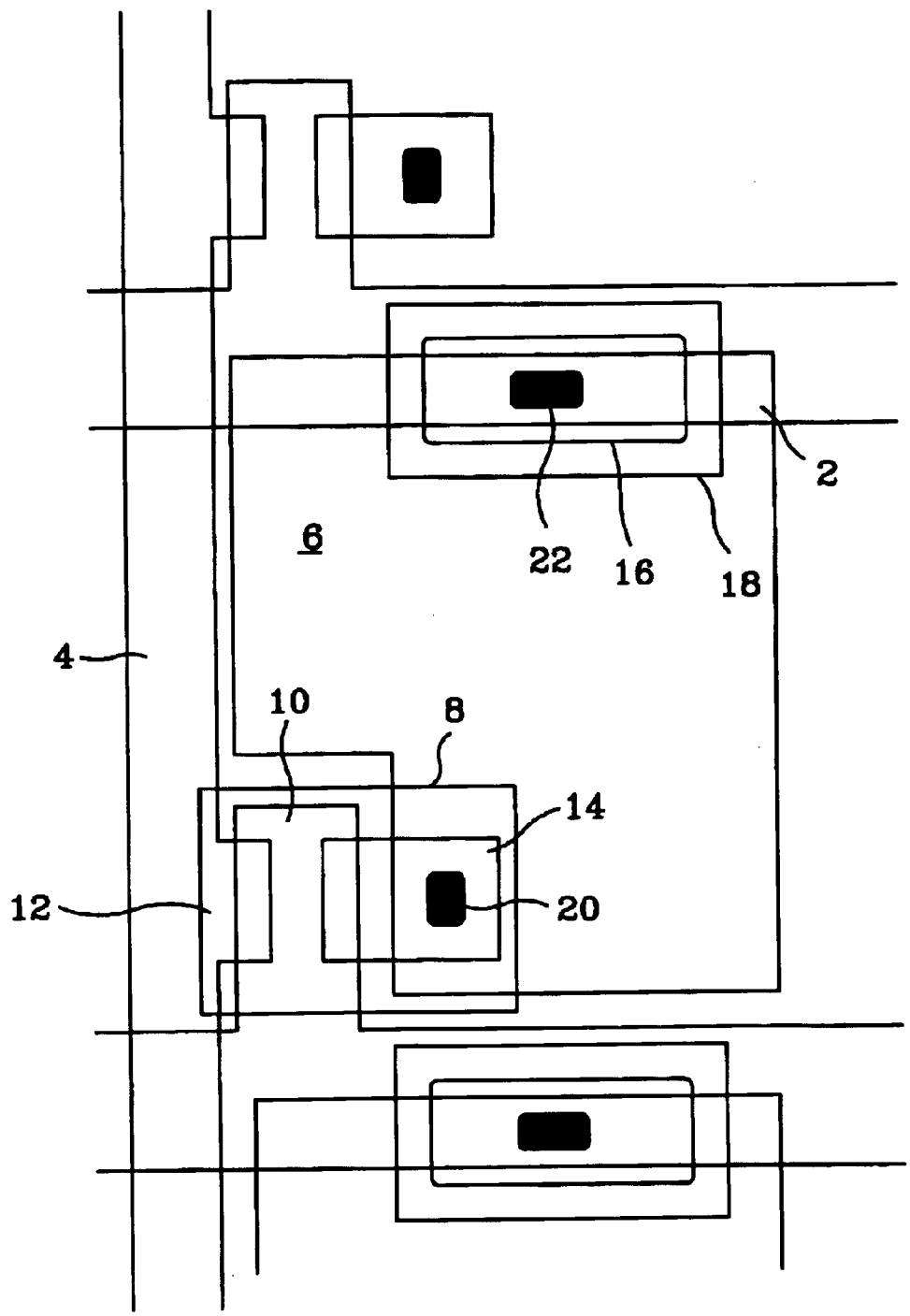
FIG. 1 illustrates an electrode arrangement of a thin film transistor substrate in a conventional liquid crystal display.
Figure 2:
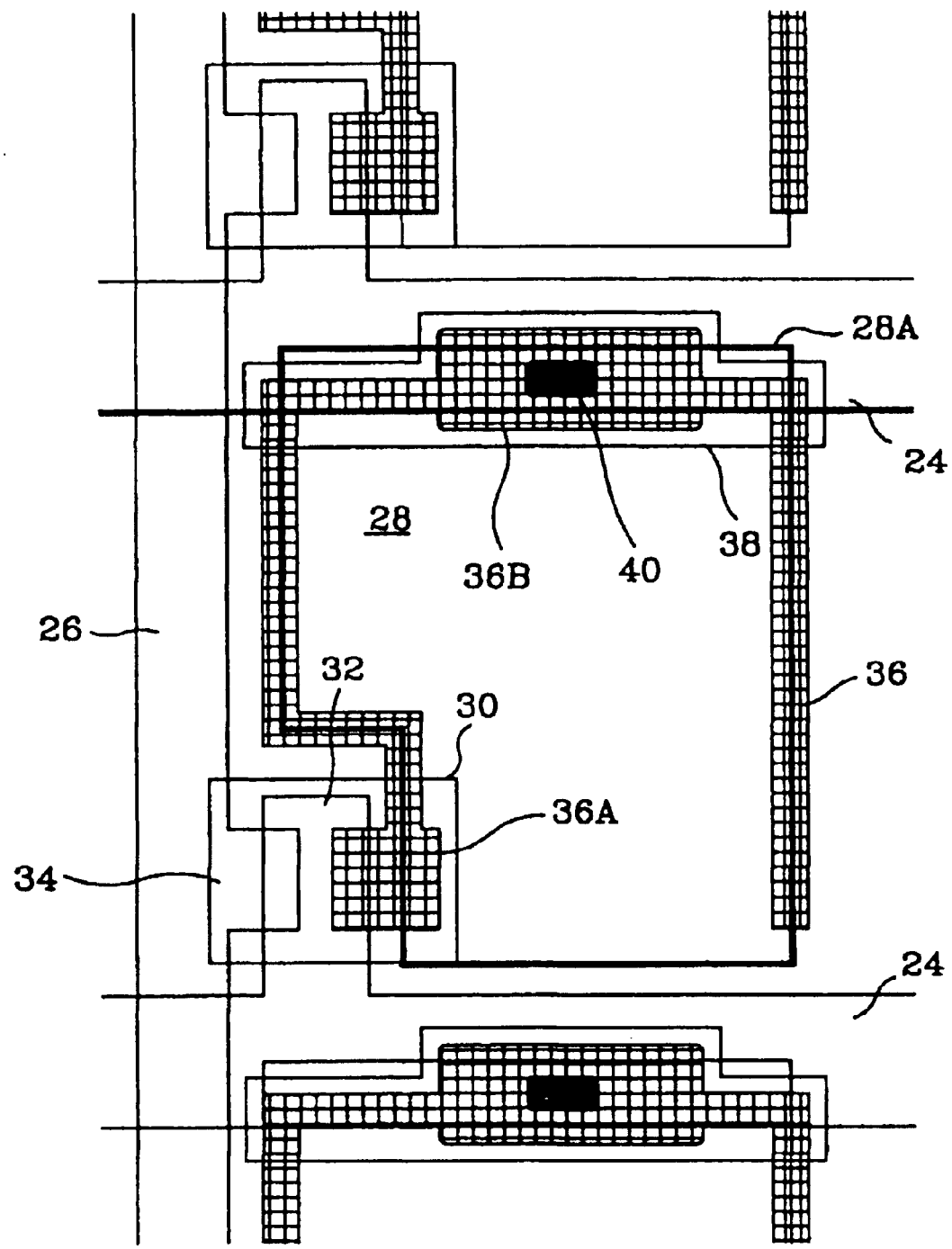
FIG. 2 illustrates an electrode arrangement of a thin film transistor substrate according to an embodiment of the present invention.

Referring to FIG. 2, there is shown an electrode arrangement of a thin film transistor substrate in a liquid crystal display according to a first embodiment of the present invention. For those elements not specifically mentioned or discussed in detail, it is to be understood that those elements are the same as in the conventional art described with respect to FIG. 1.

As shown, the liquid crystal display includes thin film transistors 30 positioned at intersections between data lines 26 and gate lines 24, and pixel electrodes 28 connected, via drain electrode patterns 36, to the thin film transistors 30. Each of the thin film transistors 30 includes a gate electrode 32 protruding from the gate line 24, a source electrode 34 protruded from the data line 26 and the drain electrode pattern 36. A gate insulating film (not shown) insulates the gate electrode 32 from the source and drain electrodes 34 and 36 and a semiconductor layer (not shown), which forms a conductive channel between the source electrode 34 and the drain electrode pattern 36 when a gate voltage is applied to the gate electrode 32.

The drain electrode pattern 36 is formed such that it overlaps a portion of the periphery of the pixel electrode 28. The drain electrode pattern 36 includes a drain electrode part 36A and a storage electrode part 36B. The drain electrode part 36A forms the drain electrode of the thin film transistor 30, and the storage electrode part 36B forms a part of a storage capacitor 38. A portion of the storage electrode part 36B overlaps part of the pre-stage gate line 24, is partially overlapped by the pixel electrode 28, and is connected, via a contact hole 40 formed in a protective film (not shown) between the storage electrode part 36B and the pixel electrode 28, to the pixel electrode 28. Accordingly, the contact hole for connecting the pixel electrode 28 to the drain electrode (i.e., the drain electrode part 36A) can be eliminated. This allows for reduction in the size of the drain electrode, and eliminates the need for the pixel electrode 28 to overlap the drain electrode part 36A. As a result, the size of the pixel electrode 28 is increased, and the aperture ratio of liquid crystal cell is increased.

The storage electrode part 36B of the drain electrode pattern 36 forms the storage capacitor 38 along with the overlapped pre-stage gate line 24 and the gate insulating film formed therebetween. Such a drain electrode pattern 36 has a relatively small width at a portion close to the data line 26 such that it is not shorted to the data line 26. Because the drain electrode pattern 36 and the data line 26 are formed from the same conductive layer during processing, (1) a constant separation interval is formed between the drain electrode pattern 36 and the data line 26, and (2) a parasitic capacitor Cds between the data line 26 and the drain electrode pattern 36 is consistently or uniformly maintained. As a result, deterioration of the data signal caused by the non-uniformity of the parasitic capacitor Cds is prevented. Also, the storage electrode part 36B of the drain electrode pattern 36 has a large width so as to provide the storage capacitor 38 with a larger capacitance value.

The thin film transistor 30 responds to the gate signal from the gate line 24 to selectively apply the data signal from the data line 26 to the pixel electrode 28. The pixel electrode 28, located at a cell area defined by the data line 26 and the gate line 24, is made from an ITO (indium tin oxide) material with a high light transmissivity. The pixel electrode 28 is formed on a protective film (not shown) coated over an entire surface of the thin film transistor substrate. The pixel electrode 28 generates a potential difference with respect to a common transparent electrode (not shown) provided at the upper, opposing substrate in response to a data signal applied via the thin film transistor 30. By this potential difference, liquid crystal positioned between the thin film transistor substrate and the upper substrate is rotated by its dielectric anisotropy to allow light, to pass therethrough. The storage capacitor 38 prevents a voltage variation in the pixel electrode 28 by charging to a voltage when a gate high voltage is applied to the pre-stage gate line 24 and discharging the charge voltage when a data signal is applied to the pixel electrode 28.

A method of fabricating the thin film transistor substrate having the configuration as mentioned above will be described. After a gate metal layer is deposited on a transparent substrate and patterned to form the gate line 24 and the gate electrode 32, a gate insulating film is coated over the substrate. After an amorphous silicon layer is formed on the gate insulating film and patterned to form a semiconductor layer of the thin film transistor 30, a source/drain metal layer is deposited and then patterned to form the data line 26, the source electrode 34 and the drain electrode pattern 36 at the same time. Subsequently, a protective film is coated over the substrate and patterned to form the contact holes 40. Finally, a transparent electrode material is coated on the protective film and then patterned to form the pixel electrode 28.

Figure 3:
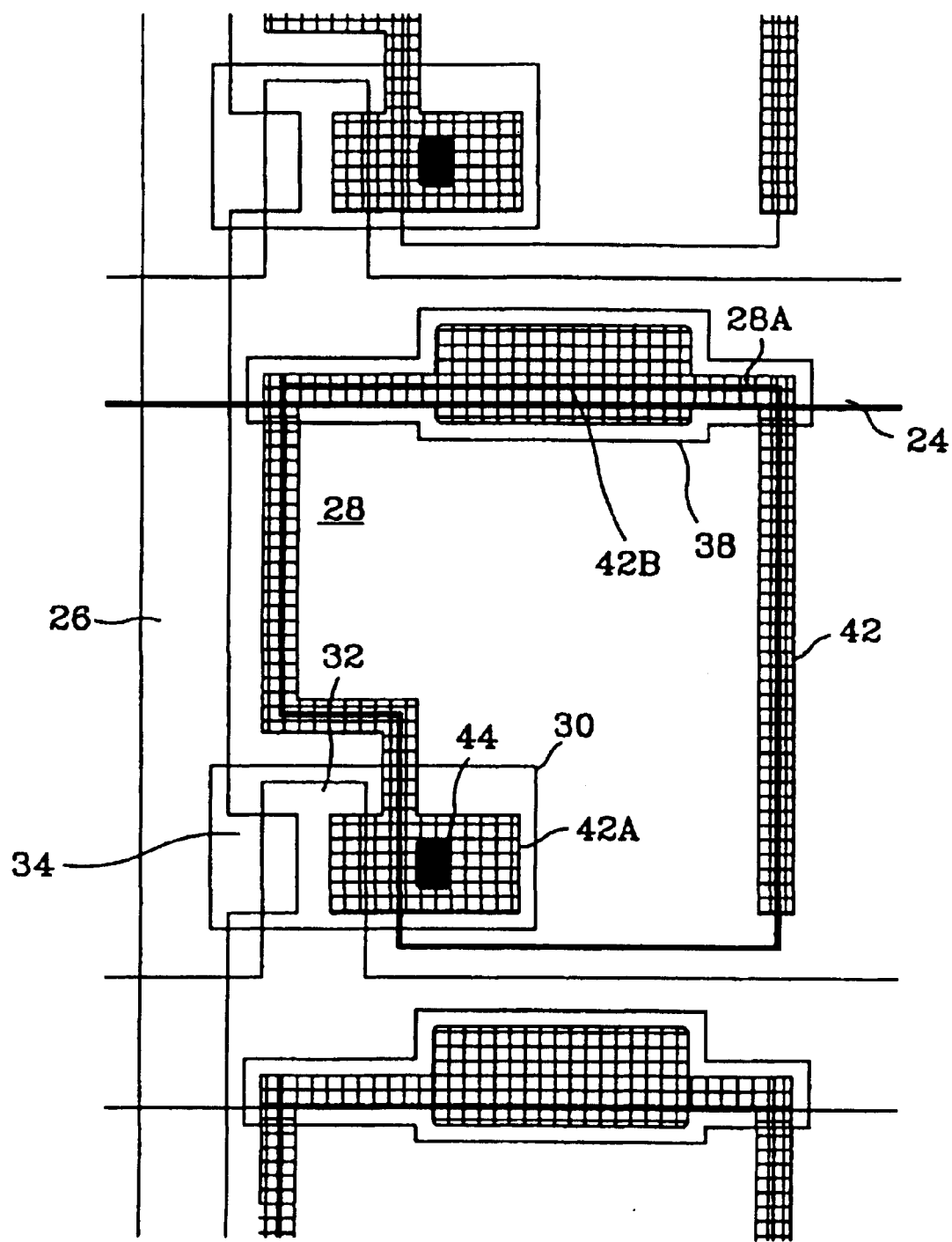
FIG. 3 illustrates an electrode arrangement of a thin film transistor substrate according to a further embodiment of the present invention.

Referring to FIG. 3, there is shown an electrode arrangement of a thin film transistor substrate in a liquid crystal display according to a second embodiment of the present invention. When compared with the thin film transistor shown in FIG. 2, the thin film transistor substrate of FIG. 3 has the same constructional elements except that the drain electrode pattern 42 is electrically connected via a contact hole 44 to the pixel electrode 28 at a drain electrode part 42A. Accordingly, the contact hole for connecting the pixel electrode 28 to storage electrode part 42B is eliminated to reduce an amount of overlap between the storage electrode part 42B and the pixel electrode 28. Note also in FIG. 3 that pixel electrode 28 overlaps gate line 24, the edge of pixel electrode 28 designated by reference 28A, and contrast FIG. 2 in which pixel edge 28A overlaps the gate line more than in FIG. 3. The contact hole for connecting the pixel electrode 28 to storage electrode part 42B is eliminated in FIG. 3.

In this embodiment, because the amount or width of the pixel electrode 28 overlapping the storage electrode part 42B of the drain electrode pattern 42 is reduced from 15 to 20 µm in the prior art to 2 to 4 µm, a potential snort between the upper and lower pixel electrodes 28 can be prevented. Also, the drain electrode pattern 42 and the data line 26 are formed from the same layer with a uniform interval therebetween to uniformly maintain a parasitic capacitor Cds between the drain electrode 26 and the drain electrode pattern 42. Therefore, a deterioration of the data signal caused by a non-uniformity of the parasitic capacitor Cds is prevented.

The thin film transistor substrate of FIG. 3 is formed by the same method as described with respect to FIG. 2, except that the protective film is patterned to form the contact holes 44 and the pixel electrodes 28 are formed to have the shape shown in FIG. 3.

Figure 4:
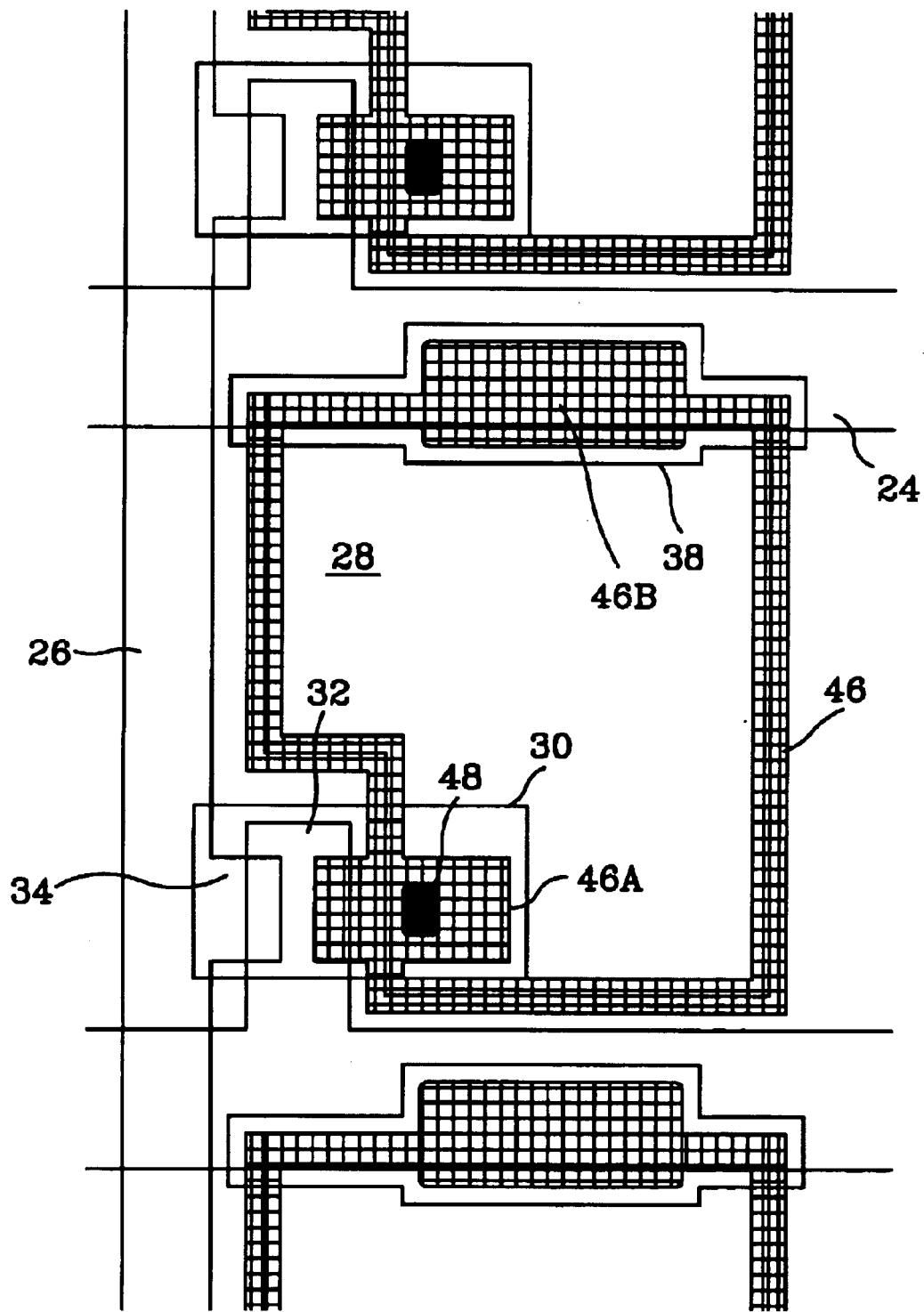
FIG. 4 illustrates an electrode arrangement of a thin film transistor substrate according to another embodiment of the present invention.

Referring to FIG. 4, there is shown an electrode arrangement of a thin film transistor substrate in a liquid crystal display according to a third embodiment of the present invention. When compared with the thin film transistor shown in FIG. 3, the thin film transistor substrate of FIG. 4 has the same constructional elements except that a drain electrode pattern 46 is formed to have an annular shape along the periphery of the pixel electrode 28. In this case, the drain electrode pattern 46 is formed in an annular shape and overlaps with the bottom periphery of the pixel electrode 28; unlike the U-shaped drain electrode patterns 36 and 42 in FIG. 2 and FIG. 3, respectively.

The drain electrode pattern 46 prevents light from leaking between the pixel electrode 28 and the gate line 24. The drain electrode pattern 46 is connected, via a contact hole 48 formed in a protective film on the drain electrode part 46A, to the pixel electrode 28. Accordingly, the contact hole for connecting the storage electrode part 46B to the pixel electrode 28 can be eliminated to reduce a width or amount by which the pixel electrode 28 overlaps with the storage electrode part 42B. This then prevents a short between the upper and lower pixel electrodes 28.

Alternatively, the drain electrode pattern 46 may be connected to the pixel electrode 28 by forming a contact hole (not shown) in the protective film on the storage electrode part 46B. In this alternative, the contact hole for connecting the drain electrode part 46A of the drain electrode pattern 46 to the pixel electrode 28 can be eliminated to reduce to the size of the drain electrode part 46A, to increase an effective size of the pixel electrode 28 while reducing an area of the pixel electrode 28 overlapping the drain electrode part 46A, and to thus increase an aperture ratio of liquid crystal cell. The drain electrode pattern 46 is also uniformly spaced from the data line 26 to uniformly maintain a parasitic capacitor Cds between the drain electrode 26 and the drain electrode pattern 46. Therefore, a deterioration of the data signal caused by a non-uniformity of the parasitic capacitor Cds is prevented.

The thin film transistor substrate of FIG. 4 is formed by the same method as described with respect to FIG. 2, except for patterning certain layers to achieve the above noted structural differences.

Figure 5:
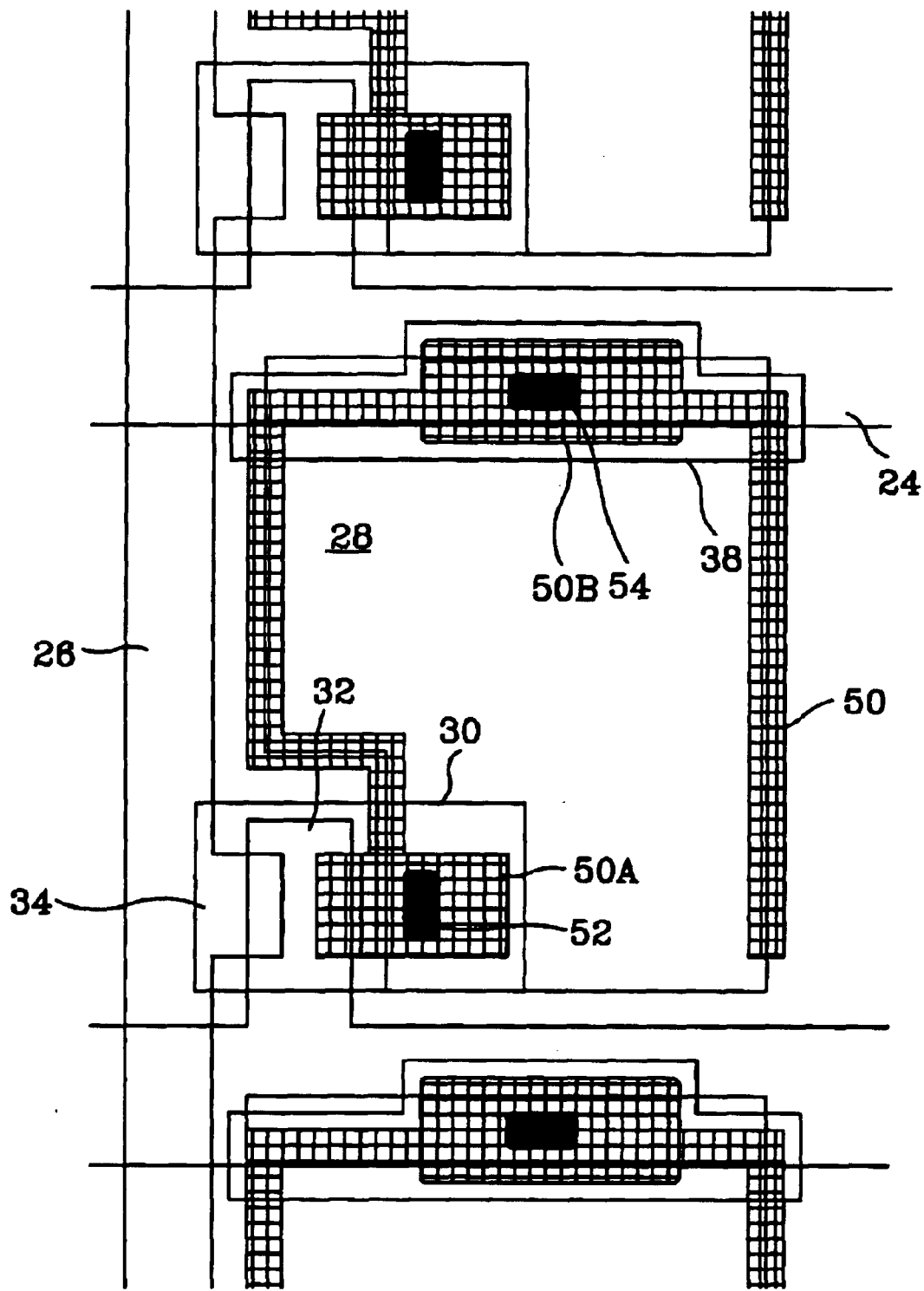
FIG. 5 illustrates an electrode arrangement of a thin film transistor substrate according to still another embodiment of the present invention.

Referring to FIG. 5, there is shown an electrode arrangement of a thin film transistor substrate in a liquid crystal display according to a fourth embodiment of the present invention. When compared with the thin film transistor shown in FIG. 3, the thin film transistor substrate of FIG. 5 has the same constructional elements except that a drain electrode pattern 50 is electrically connected, via contact holes 52 and 54, to the pixel electrode 28 at a drain electrode part 50A and a storage electrode part 50B, respectively. The drain electrode pattern 50 is electrically connected, via the contact hole 52 formed in a protective film on the drain electrode part 50A, to the pixel electrode 28 and, at the same time, is electrically connected, via the contact hole 54 formed in a protective film on the storage electrode part 50B, to the pixel electrode 28. Also, the drain electrode pattern 50 and the data line 26 are formed from the same conductive layer during processing and at a constant separation interval to uniformly maintain a parasitic capacitor Cds between the drain electrode 26 and the drain electrode pattern 50. Therefore, a deterioration of the data signal caused by a non-uniformity of the parasitic capacitor Cds is prevented.

The thin film transistor substrate of FIG. 5 is formed by the same method as described with respect to FIG. 2, except for patterning certain layers to achieve the above noted structural differences.

As described above, according to embodiments of the present invention, the drain electrodes are connected to the storage electrodes in a manner to reduce the number of contact holes, increase an aperture ratio, and prevent shorts between pixel electrodes. Also, a space between the data line and the drain electrode pattern connected to the pixel electrode becomes consistent to maintain a uniform parasitic capacitor Cds and prevent deterioration of the data signal caused by a non-uniformity of the parasitic capacitor Cds.

Although the present invention has been explained by the embodiments shown in the drawings described above, it should be understood to the ordinary skilled person in the art that the invention is not limited to the embodiments, but rather, various changes or modifications thereof are possible without departing from the spirit of the invention.

What is claimed is:

1. A liquid crystal device having a thin film transistor, comprising:
    a plurality of gate lines formed on a substrate;
    a plurality of data lines insulated from and intersecting said gate lines, said data lines and intersecting gate lines defining a plurality of cells, at least one cell including,
        a pixel electrode,
        a thin film transistor connected to one of the data lines and one of the gate lines defining the cell,
        a storage capacitor, and
        a metallic pattern, surrounding the cell, including a drain electrode of the thin film transistor and a storage electrode of the storage capacitor in a single layer and being electrically connected to the pixel electrode, wherein said storage electrode is an upper storage electrode of the storage capacitor, and is formed over the one of the gate lines.

2. The liquid crystal device of claim 1, wherein the metallic pattern is spaced a predetermined distance from the data line connected to the thin film transistor.

3. The liquid crystal device of claim 2, further comprising:
a protective layer disposed between the pixel electrode and the metallic pattern, and wherein
a portion of a periphery of the pixel electrode overlaps the metallic pattern.

4. The liquid crystal device of claim 1, further comprising:
a protective layer disposed between the pixel electrode and the metallic pattern, and wherein
a portion of a periphery of the pixel electrode overlaps the metallic pattern.

5. The liquid crystal device of claim 4, wherein
the metallic pattern has an annular shape, and
an entire periphery of the pixel electrode overlaps the metallic pattern.

6. The liquid crystal device of claim 5, wherein the metallic pattern is spaced a predetermined distance from the data line connected to the thin film transistor.

7. The substrate of claim 1, further comprising:
a protective layer disposed between the pixel electrode and the metallic pattern, and wherein
the pixel electrode is connected to a storage electrode part of the metallic pattern via a first contact hole in the protective layer.

8. The liquid crystal device of claim 7, wherein the protective layer does not include a contact hole over a drain electrode part of the metallic pattern.

9. The liquid crystal device of claim 8, wherein the drain electrode part has a greater area than a drain electrode part electrically connected to the pixel electrode via a contact hole in the protective layer over the drain electrode part.

10. The liquid crystal device of claim 8, wherein the pixel electrode has a larger aspect ratio than if the drain electrode part was electrically connected to the pixel electrode via a contact hole in the protective layer over the drain electrode part.

11. The liquid crystal device of claim 8, wherein
the metallic pattern is spaced a predetermined distance from the data line connected to the thin film transistor; and
a portion of a periphery of the pixel electrode overlaps the metallic pattern.

12. The liquid crystal device of claim 8, wherein
the metallic pattern has an annular shape and is spaced a predetermined distance from the data line connected to the thin film transistor; and
an entire periphery of the pixel electrode overlaps the metallic pattern.

13. The liquid crystal device of claim 7, wherein
the pixel electrode is connected to a drain electrode part of the metallic pattern via a second contact hole in the protective layer.

14. The liquid crystal device of claim 13, wherein
the metallic pattern is spaced a predetermined distance from the data line connected to the thin film transistor; and
a portion of a periphery of the pixel electrode overlaps the metallic pattern.

15. The liquid crystal device of claim 13, wherein
the metallic pattern has an annular shape and is spaced a predetermined distance from the data line connected to the thin film transistor; and
an entire periphery of the pixel electrode overlaps the metallic pattern.

16. The liquid crystal device of claim 1, further comprising:
a protective layer disposed between the pixel electrode and the metallic pattern, and wherein
the pixel electrode is connected to a drain electrode part of the metallic pattern via a contact hole in the protective layer.

17. The liquid crystal device of claim 16, wherein the protective layer does not include a contact hole over a storage electrode part of the metallic pattern.

18. The liquid crystal device of claim 17, wherein the pixel electrode overlaps a gate line, defining the cell but not connected to the thin film transistor, the overlap of the gate line being less than an overlap in a case wherein the protective layer includes a contact hole over a storage electrode part of the metallic pattern.

19. The liquid crystal device of claim 17, wherein
the metallic pattern is spaced a predetermined distance from the data line connected to the thin film transistor; and
a portion of a periphery of the pixel electrode overlaps the metallic pattern.

20. The liquid crystal device of claim 16, wherein
the metallic pattern has an annular shape and is spaced a predetermined distance from the data line connected to the thin film transistor; and
an entire periphery of the pixel electrode overlaps the metallic pattern.

21. A liquid crystal device having a thin film transistor, comprising:
a plurality of gate lines formed on a substrate;
a plurality of data lines insulated from and intersecting said gate lines, said data lines and intersecting gate lines defining a plurality of cells, at least one cell including,
a pixel electrode,
a thin film transistor interposed between one of the data lines and the pixel electrode and including a source electrode connected to the one of the data lines, a gate electrode connected to one of the gate lines, a drain electrode, and
a storage capacitor, surrounding the cell, including a storage electrode and a drain electrode in a single layer, the storage capacitor being connected to the pixel electrode, wherein said storage electrode is an upper storage electrode of the storage capacitor and is formed over the one of the gate lines.

22. The liquid crystal device of claim 21, wherein the storage electrode and the drain electrode are connected to each other by a metallic pattern.

23. A method of manufacturing a thin film transistor substrate, comprising:
forming a gate line having a gate electrode on a transparent substrate;
forming a gate insulating layer on the gate electrode;
forming a semiconductor layer on the gate insulating layer;
simultaneously forming a data line having a source electrode, and a metallic pattern including a drain electrode part and a storage electrode part in a single layer, wherein the storage electrode part is an upper storage electrode of a storage capacitor and is formed over the gate line;

forming a protective film over the entire surface; and forming a pixel electrode over the protective film.

24. The method of claim 23, wherein the forming the data line and the metallic pattern step is performed simultaneously by forming a conductive layer over the substrate and patterning the conductive layer to form the data line and the metallic pattern such that the metallic pattern is spaced a predetermined distance from the data line.

25. The method of claim 23, wherein the forming a pixel electrode step forms the pixel electrode such that a portion of a periphery of the pixel electrode overlaps the metallic pattern.

26. The method of claim 23, wherein the forming a pixel electrode step forms the pixel electrode such that an entire periphery of the pixel electrode overlaps the metallic pattern.

27. The method of claim 23, wherein the forming a protective layer step forms the protective layer with a first contact hole exposing the storage electrode part of the metallic pattern.

28. The method of claim 27, wherein the forming a protective layer step does not form the protective layer with a contact hole exposing the drain electrode part of the metallic pattern.

29. The method of claim 27, wherein the forming a protective layer step forms the protective layer with a second contact hole exposing the drain electrode part of the metallic pattern.

30. The method of claim 23, wherein the forming a protective layer step forms the protective layer with a contact hole exposing the drain electrode part of the metallic pattern.

31. The method of claim 30, wherein the forming a protective layer dos not form the protective layer with a contact hole exposing the storage electrode part of the metallic pattern.

* * * * *